United States Patent [19]

Konechny, Jr.

[11] Patent Number: 4,758,063

[45] Date of Patent: Jul. 19, 1988

[54] OPTICAL DEVICE AND CIRCUIT BOARD SET

[76] Inventor: Edward T. Konechny, Jr., 5100 Columbia Pike, Arlington, Va. 22204

[21] Appl. No.: 864,839

[22] Filed: May 20, 1986

[51] Int. Cl.[4] .............................................. G02B 6/24
[52] U.S. Cl. ............................. 350/96.20; 350/96.11; 350/96.15; 357/40; 361/401
[58] Field of Search ............... 350/96.10, 96.11, 96.12, 350/96.15, 96.20; 357/40; 250/227; 361/397, 400, 401

[56] References Cited

FOREIGN PATENT DOCUMENTS 0171615 2/1986 European Pat. Off. ......... 350/96.11
0119312 7/1984 Japan ................................. 350/96.11

OTHER PUBLICATIONS

Marx et al, "Integrated Optical Detector Array, Waveguide, and Modulator Based on Silicon Technology", Feb. 1977, *IEEE Journal of Solid-State Circuits*, vol. SC. 12, No. 1, Feb. 1977, pp. 10–13.

*Primary Examiner*—John Lee
*Assistant Examiner*—Phan Heartney
*Attorney, Agent, or Firm*—William F. Frank

[57] ABSTRACT

A plane or "board" for use in the interconnection of a plurality of optical circuit devices is disclosed. Each circuit device will have attached at least one optical signal transmission fiber or rod for the express purpose of communication external to such device by optical means, as well as any means for the purpose of electrical signal transmission. Electrical interconnections are provided using traditional methods, including the use of soldering techniques. Optical interconnections are afforded by means of optical rods or filaments which originate in the circuit devices themselves, and are joined to the optically conducting path of the circuit board by use of either sonic of ultrasonic acoustical energy. The use of acoustical energy in this manner will produce a welded junction which couples optical signals between these two materials. This ultrasonic welding procedure can be accomplished using a handheld tool, much as an electrical soldering iron is presently used.

9 Claims, 2 Drawing Sheets

OPTICAL DEVICE AND CIRCUIT BOARD SET

BACKGROUND OF THE INVENTION

There have been a number of recent inventions related to the optical coupling of circuit devices to external optical signal transmission media. Some examples of these inventions will now be described. As an initial example, an integrated circuit package containing a photo-responsive semiconductor element with integral optical input coupler was developed by T. Frederiksen in U.S. Pat. No. 4,188,708, issued Feb. 19, 1980. For the next example, an optoelectronic semiconductor device with mounted optical fiber was designed by N. Inagaki in U.S. Pat. No. 4,316,204, issued Feb. 16, 1982. A low cost electro-optical connector was developed to connect an optical fiber to a plastic encapsulated electro-optical semiconductor device, by D. Stevenson in U.S. Pat. No. 4,439,006, issued Mar. 27, 1984. From these examples, it is clear that the present trend to produce optical signal processing devices to interface with an optical signal transmission medium. From this trend in circuit devices, there arises a present need for an efficient means to interconnect such optical signal elements.

The present invention relates to the optical interconnection of a plurality of individual circuit devices, or separate circuit boards, by means of a circuit board which provides the requisite electrical signal and optical signal communication linkages. This circuit board will facilitate the development of analog and digital signal processing of ever greater speed, and will provide intercommunication between the individual signal processing circuit elements of wide information bandwidths. Conventional electrical circuit connection boards alone do not have the device intercommunication capacity needed to best use modern electrical or electrical-optical devices to take advantage of their potential signal processing speed. The provision of optical channels will afford device intercommunication pathways of satisfactory bandwidth for use with such modern electrical-optical devices.

An optical data processing board was developed by R. Lindsey in U.S. Pat. No. 3,943,021, issued Mar. 9, 1976. This module structure includes a plurality of interconnected optical fibers which must be mechanically positioned for each circuit board which is to be reproduced. This method of optical circuit board fabrication is extremely labor intensive and is not easily adapted for automated manufacturing procedures. In addition to this problem, interfaces to this circuit board structure by means of several optical "windows" is not reliable due to the presence of dust and dirt, which may accumulate between the interface of an optical window and other optically conducting media. This invention does not pose an economically attractive alternative to the potential demand for optical device intercommunications on a circuit board.

A multilayer ceramic module, having optical channels fabricated therein, was developed by H. Kaiser in U.S. Pat. No. 4,169,001, issued Sept. 25, 1979. This multilayer ceramic structure is best suited for the fabrication of a hybrid microelectronic electrical-optical device, and is not well suited for the production of an entire circuit board. The manner of fabrication of such a device would make the process of the fabrication of an entire optical signal interconnection board by this method an economically prohibitive alternative. This invention will not satisfy a potential demand for optical circuit boards.

The circuit board of the present invention provides an attractive alternative to the previous inventions by its ease of fabrication by well established methods, and by its suitability to automated manufacture for economical mass production. In accordance with the present invention, previous inventions that apply to aspects of this optically conducting electronic circuit board are now presented. Specifically, the electrically conducting circuit board initially appeared in U.S. Pat. No. 2,695,351 by J. Beck et al, issued Nov. 23, 1954. The analogous structure of a monolithic optical circuit with formed optical channels appeared in U.S. Pat. No. 4,472,020 by V. Evanchuk, issued Sept. 18, 1984. This invention applies most appropriately to an individual device structure rather than to an entire device interconnection board. The ultrasonic welding of small elements having a small area of contact by use of a handheld tool appeared in U.S. Pat. No. 3,053,124 by L. Balamuth et al, issued Sept. 11, 1962. The ultrasonic welding of two adjacent optical fiber elements, for the purpose of establishing an optical signal coupling, appeared in U.S. Pat. No. 4,265,689 by C. Jeffrey, issued May 5, 1981.

SUMMARY OF THE INVENTION

This disclosed invention can provide a multiplicity of conducting pathways for either analog or digital optical signals. These optically conducting pathways can interconnect a plurality of circuit devices, each of which has one or more optical signal conducting elements protruding therefrom. A circuit plane or board is formed, preferably using a layer of optically transparent plastic or glass, with the optically transparent layer bonded to at least one layer of optically opaque material, to provide mechanical strength to the overall circuit board, and to afford a measure of protection to the layer of optically transparent material. One or more apertures or holes are formed in the board which transverse from the external surface of the opaque material to within the optically transparent material, such that an optically conducting rod or fiber emanating from a circuit device, one or more separate optical circuit boards, or other optical signal source or sink, can be mounted within this circuit board aperture and placed into intimate contact with the optically transparent layer. An optical connection is formed such that optical signals can freely pass in either direction between them by the fusion of optical rod or filament material with that portion of the circuit board optically transparent layer that is local to and is in intimate contact with the optical rod or filament, using either sonic or ultrasonic acoustical energy to form this welded connection. The instrument which is used to form these welded connections may include a handheld instrument to form individual optical connections, or a larger instrument that uses a uniform layer of acoustically coupled liquid to form several of these optical connections simultaneously. These optical connections may additionally be used to couple optical signals from either off board optical signal elements or other optical signal boards to the optically transparent board layer.

By employing an optically opaque layer consisting of an electrically conducting layer joined to a thermally insulating layer of material, electrical signals may also be interconnected between mounted circuit devices, and between such devices and electrical elements external to the circuit board. Independent channels can be formed in the optically conductive layer, electrically conductive layer, or both in order to provide a plurality of electrical or optical signal propagation pathways between the several electrical connections or between the several optical connections respectively. A multiple layered structure can be formed composed of several of these electrically conducting layers and optically conducting layers, in order to provide many more independent optical or electrical signal routing pathways. A focused beam of sonic or ultrasonic acoustical energy can be used to weld a desired layer of a multiple layer optical circuit board, with the other layers remaining unchanged.

These and other objects of the present invention will become apparent upon reading the specification together with the accompanying drawings.

DETAILED DESCRIPTION OF PREFERRED EMBODIMENT

Figure 1:
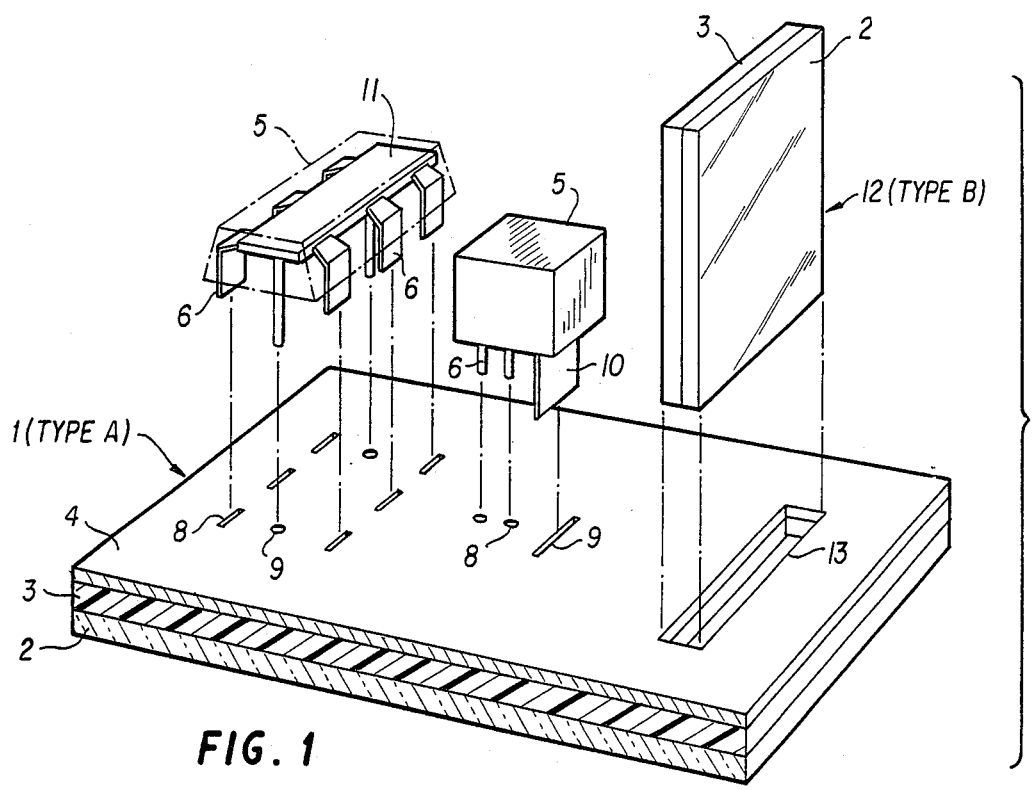
FIG. 1 illustrates a side perspective view of an optical signal conducting circuit board with associated electrically or optically coupled circuit devices.

Referring now in detail to FIG. 1, there is shown optical circuit board 1, hereinafter referred to as the circuit board of type A. In this figure, optically transparent transmission layer 2 is joined to optically opaque layer 3 of the circuit board of the present invention. Additionally, layer 3 may consist of thermally insulating material, and is joined to electrically conducting layer 4.

The several individual layers of this circuit board or variations thereof are bonded together by means of those methods of standard practice including the use of adhesive materials, welding techniques, or heat treatments.

Circuit device 5 has protruding electrical conductors 6 with one or more protruding optical signal transmission rods or fibers 7. This device is to be mounted onto the type A circuit board such that electrical conductors 6 fit into apertures 8 and optical signal conductors 7 fit into apertures 9. Optionally, the optical signal conducting rod or fiber may be shaped, as for example shaped rod 10, in order to facilitate proper alignment of the circuit device for placement on the type A circuit board. Signal couplings are formed to establish electrical or optical signal lines of communication from circuit elements 11 with corresponding circuit board conducting layers. Optical transmission rod or fiber 7 or 10 passes through formed aperture in opaque layers 4 and 3 and then is placed in intimate contact with optical layer 2 by means of a welded connection formed by use of acoustic energy, typically of frequency between 16 to 25 kilohertz. This welded connection will freely pass optical signals between optical rod 7 or 10 and optical layer 2 in either direction.

Optical transmission layer 2 may be fabricated from any good optically transparent medium such as plastic, glass, or other material. Opaque material 3 may be constructed from any suitable material or combination of materials that do not afford transmission of optical signals within it, such as fiberglass, resinous plastic, or teflon materials. These materials will lend a degree of inherent mechanical strength to the overall circuit board. This specific type A circuit board is fabricated of optically opaque layer 3 joined to electrically conductive layer 4 in which opaque layer 3 consists of electrically insulating and thermally insulating material, such as that named above. Electrically conducting layer 4 consists of material such as copper, silver, or aluminum to provide the means for constructing electrical signal conducting pathways using those methods of standard practice including the use of solder. In this example, electrical conductors 6 are joined to electrically conducting layer 4 by means of a soldered or welded joint. Optical transmission rod 7 or 10 passes unimpeded through an aperture in layer 4, then passes unimpeded through an aperture in layer 3, and then is terminated in layer 2 with an optical signal coupling consisting of a welded connection formed by means of sonic or ultrasonic acoustical energy.

Circuit elements 11 may consist of individual semiconductor electronic devices with integral optical signal transmission or reception elements, integrated optical signal processing elements whose method of operation is principally optical in nature, integral magnetic energy devices coupled to optical signal transmission media, or integral electromagnetic energy devices coupled to optical signal transmission media. Alternatively, another optical circuit board may be attached to the initially described type A circuit board. Shown in FIG. 1 is additional circuit board 12 constructed of optical transmission layer 2 joined to opaque layer 3, and is hereinafter referred to as the circuit board of type B. The type B circuit board is mounted through aperture 13 in the type A circuit board such that individual optical layers 2 of each circuit board are intimately joined by means of acoustical energy to form an optical signal coupling, as was previously mentioned.

Figure 2:
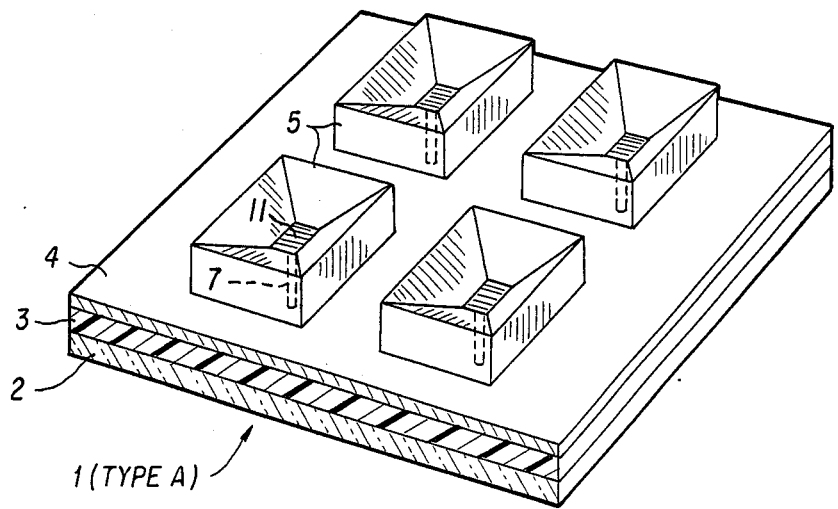
FIG. 2 illustrates the specific application of this circuit board to the optical signal interconnection of a number of individual microwave devices to form a phased antenna array.

FIG. 2 illustrates the specific application of this type A circuit board to an optically coupled phased antenna array of microwave circuit devices. Individual microwave antenna devices 5 are mounted onto type A circuit board 1, such that electrical signals are conducted by means of electrical transmission layer 4, and microwave signal modulated optical energy is conducted by means of optical transmission layer 2. Each device contains an active microwave element 11 which is coupled to optical conducting fiber 7. Each of these fibers passes through apertures in type A circuit board 1 through layer 4 and layer 3 into layer 2, to which they are optically coupled by means of acoustically welded connections. Electrical power is transferred to each microwave antenna device by means of electrical circuit paths formed in electrically conducting layer 4.

Figure 3:
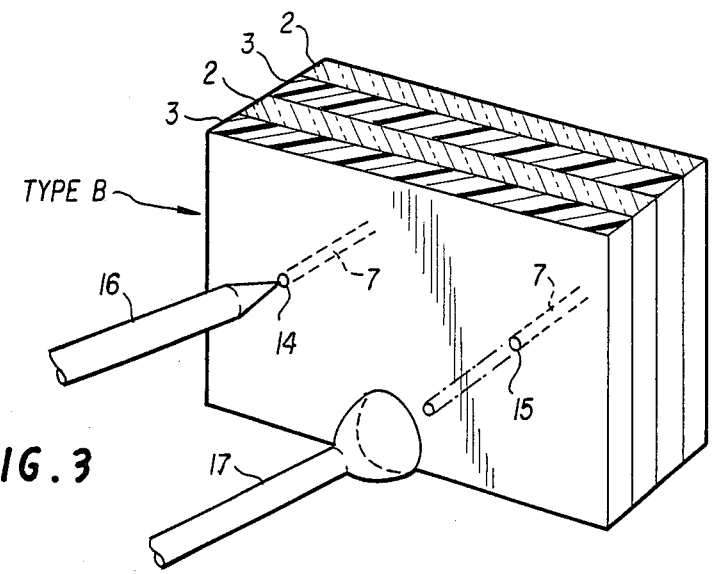
FIG. 3 illustrates the spot welding of circuit devices to a multiple layer optical circuit board to form individual optical signal couplings.

A multiplicity of electrically or optically conducting channels can be formed from a multiple layer construction of a type A or type B circuit board. FIG. 3 illustrates one specific example of a multiple layer type B circuit board 12, in which independent optical transmission layers 2 are separated by optically opaque layers 3.

This type B multiple layer circuit board construction provides optically coupled connections 14 and 15 to embedded optical signal conducting rods 7, as has been previously described. Surface optical coupling 14 is formed by means of acoustical welding instrument 16, which applies energy directly to an optical transmission surface of the circuit board. The specific handheld acoustical welding instrument of U.S. Pat. No. 3,053,124 by L. Balamuth et al can provide the specific tool 16 that is shown schematically in FIG. 3. Internal optical coupling 15 is formed by means of acoustical welding instrument 17, which applies its energy in a focused manner effectively within the bulk region of this multiple layered type B circuit board structure such that optical signal couplings are formed to one or more desired layers with this optical rod, but not with any of the undesired circuit board layers.

A focused beam acoustical welding instrument, shown schematically as 17 in FIG. 3, can be constructed as either a passive reflecting device or as an active directed energy acoustical transducer. Passive reflecting devices make use of specific geometric shapes to reflect acoustical energy from an active transducer to form a focused beam, using such geometric shapes as paraboloidal, spherical, hyperboloidal, conical, or rectangular corner. Active directed energy acoustical devices can make use of geometrically shaped transducer material to focus acoustical energy into a focused beam, much as a lens would focus light energy. In fact, auxiliary shaped material can be used as an external acoustical energy focusing lens, in order to augment the action of either of the aforementioned acoustical energy devices. Specific elements constructing an acoustical energy lens may consist of solid, liquid, or gaseous material.

This multiple layer circuit board construction provides for the several intercommunications between a plurality of individual circuit devices optically coupled to this multiple layer circuit board, and provides an easy mechanism for cross coupling of optical signals by means of embedded optical conductors between layers. Protective covering layers can be used to insure that foreign material does not cause wear, damage, or other undesired effects to any exposed portions of optically conductive media.

Figure 4:
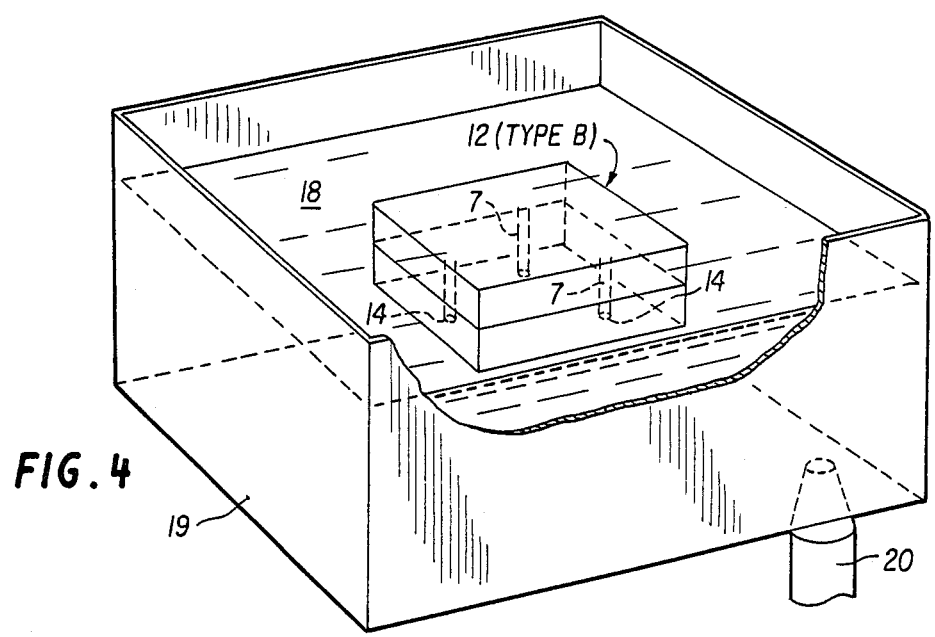
FIG. 4 illustrates the immersion welding of an optical circuit board to simultaneously form several optical signal couplings.

As an alternative welding technique, FIG. 4 shows the simultaneous formation of several optical coupling welds 14 to type B optical circuit board 12, which is immersed within acoustically conducting fluid 18 contained in vessel 19, which is coupled to acoustical energy source 20.

Figure 5:
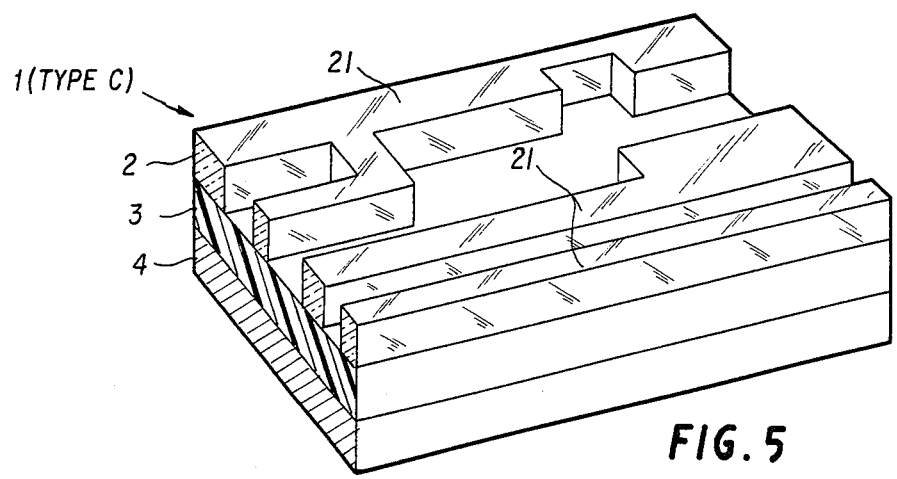
FIG. 5 shows a side perspective view of an optical signal conducting board with formed optical channels.

Several independent signal transmission channels can be formed from either an electrically conducting layer or from an optically conducting layer. FIG. 5 illustrates a modified type A circuit board 1, hereinafter referred to as the circuit board of type C. In this type C circuit board 1, electrical transmission layer 4 is joined to electrically and thermally insulating layer 3, which is joined to representative optically conducting channels 21 formed from optical transmission layer 2, using those methods of standard practice including chemical, mechanical, or electronic etching techniques. Electrically conducting channels may also be formed from electrical transmission layer 4, much as that described for the optical transmission layer, using those methods of standard practice, including chemical, mechanical, or electronic etching techniques. Both electrically and optically conducting channels can be combined into one complete physical circuit board construction.

While the invention has been particularly described with reference to the preferred embodiments thereof, it will be understood by those skilled in the art that the foregoing and other changes in form and details may be made therein without departing from the spirit and scope of the invention.

The embodiments of the invention in which an exclusive property or privilege is claimed are defined as follows:

1. An electrical-optical circuit board for the attachment of at least one separately packaged electrical, electronic, or optical device, which may consist of monolithic or hybrid electrical, electronic, or optical integrated circuits, said electrical-optical circuit board comprising at least one layer of an optically transparent material and at least one layer of an optically opaque and electrically conductive material joined to said optically transparent layer, said optically transparent layer having at least one optical transmission channel formed therein to receive and conduct optical signals through said board to and from optical transmission elements external to said board, said optically transparent layer, and said at least one optically opaque layer, having at least one aperture therein to provide access to said at least one optical transmission channel by at least one optical transmission means external to said board, said optically transparent layer having at least one connection means therein to export optical signals to and import optical signals from, and further said optically opaque or said optically transparent layer selectively having at least one electrical connection means therein of the present state of the art to export electrical signals to and import electrical signals from said electrical, electronic, or optical devices external to said electrical-optical circuit board, said devices selectively including additional electrical or electrical-optical circuit boards of various types.

2. The electrical-optical cicuit board according to claim 1 wherein said optically transparent layer, and said optically opaque layer, has at least one aperture to receive at least one optical transmission element for connection to said optically transparent layer forming an optical transmission channel by the optical connection means of claim 1, said optical connection means consisting of sonic welding to produce continuous mechanical connections so that optical signals pass through with little or no attenuation.

3. The electrical-optical circuit board according to claim 2 wherein said optically transparent layer includes more than one optical transmission channel and means within said layer to cross-couple said transmission channels, said cross-coupling consisting of common optical transmission channels.

4. The electrical-optical circuit board according to claim 3 wherein two or more said optically transparent layers include integral optical conductors between and within said layers to cross-couple more than one said optical transmission channel, each said integral optical conductor consisting of a common optical transmission channel.

5. The electrical-optical circuit board according to claim 1 wherein said optically opaque layer, or selectively said optically transparent layer, has at least one electrical connection means therein derived from well known methods, to export electrical signals to and import electrical signals from electrical, electrical-optical, or electronic elements external to said board, which elements selectively include additional electrical or electrical-optical circuit boards of various types.

6. The electrical-optical circuit board according to claim 5 wherein said optically opaque layer includes more than one electrical connection means within said layer to cross-couple electrical signals to other layers of said electrical-optical circuit board.

7. The electrical-optical circuit board according to claim 6 wherein two or more said electrically conductive layers include integral electrical conductors between and within said layers to crosscouple electrical signals between them said cross-coupling consisting of common electrical connection means.

8. The method of attachment of the separately packaged electrical, electronic, or optical devices to the electrical-optical circuit board of claim 1 wherein each said separately packaged electrical, electronic, or optical device incorporates within it one or more said optical transmission means, said optical transmission means furnishing a connection means to the electrical-optical circuit board, said electrical-optical circuit board having at least one aperture therein to provide access to said at least one optically transparent layer by at least one optical transmission means external to said board originating within said separately packaged electrical, electronic, or optical devices, said optically transparent layer consisting of an optical transmission channel for interconnection of one or more said optical transmission means originating within said separately packaged electrical, electronic, or optical devices, said separately packaged electrical, electronic, or optical devices, including monolithic, hybrid, electrical, electronic, or optical integrated circuits.

9. The electrical-optical circuit board according to claim 1 wherein said optically opaque layer comprises an electrically conductive layer joined to a thermally insulating layer to retain overall structural integrity of said electrical-optical circuit board from undesirable heat applied to it by said separately packaged electrical, electronic, optical devices or layers of said electrical-optical circuit board itself during manufacture of said board and its initial population with said separately packaged electrical, electronic, or optical elements, and during normal operational use, said electrically conductive layer having at least one means therein to provide for connection to at least one electrical external means therein to export electrical signals to and import electrical signals from electrical or electronic elements external to said board, including additional electrical or electrical-optical circuit boards of various types.

* * * * *